ATOMIC OR MOLECULAR OSCILLATOR CIRCUIT

INVENTORS
ROBERT H. DICKE AND
THOMAS R. CARVER
BY W. J. Collins
AGENT

INVENTORS
ROBERT H. DICKE AND
THOMAS R. CARVER
BY W. J. Collins
AGENT

INVENTORS
ROBERT H. DICKE AND
THOMAS R. CARVER
BY M. J. Collins
AGENT 2,836,722

ATOMIC OR MOLECULAR OSCILLATOR CIRCUIT

Robert H. Dicke and Thomas R. Carver, Princeton, N. J.

Application October 24, 1955, Serial No. 542,420

23 Claims. (Cl. 250—36)

This invention relates generally to microwave oscillators, and particularly to atomic or molecular oscillators employing microwave resonant media in which the build-up of electromagnetic oscillations develops as a result of quantum energy transition processes and such oscillations are sustained by means of a negative resistance effect.

A class of microwave oscillators or generators is known which may be termed "atomic or molecular" oscillators. Such oscillators employ microwave resonant media and utilize the phenomena that these media are capable of either emitting or absorbing microwave energy at one or more discrete frequencies at which the media exhibit resonance. These oscillators are characterized by extremely high frequency stability, in some instances as great as one part in $10^{10}$.

In one type oscillator includible in this general class the particles of the particular microwave resonant medium chosen, for example, the atoms of one of the alkali metals, are contained in a cavity resonator and initially are in a thermal equilibrium condition. Photon resonance radiation is applied to the medium to disturb the thermal equilibrium condition of the atoms and thereby produce an increased population of preferred atomic quantum energy levels. The technique for producing the increased populations of certain quantum energy levels is known as "optical pumping." The atoms in these preferred quantum energy levels undergo energy level transitions which result in the build-up within the resonator of electromagnetic oscillations at a frequency determined by the energy difference between two energy levels of interest.

In another type of atomic or molecular oscillator, a beam of electrically neutral atoms or molecules is produced which moves at thermal velocities. The beam effectively is separated or divided into two beam branches by means of a deflection field having a gradient. The atoms or molecules in one beam branch have greater energies than the atoms or molecules in the other beam branch. A hollow wave energy structure, such as a cavity resonator, is positioned and designed to receive the atoms or molecules having the greater energies. These atoms or molecules undergo energy level transitions within the resonator which result in an emissive effect at a frequency at which the atoms or molecules are resonant. Electromagnetic oscillations build up within the resonator at this resonant frequency.

In each of the foregoing cases, and in some other atomic or molecular oscillator arrangements which depend for their operation on energy level transitions, it has been found that it is extremely difficult to cause the oscillators to self-oscillate, i. e., produce sustained oscillations. This difficulty is presented primarily because the amount of energy released in the quantum transition process is quite small. In order for these arrangements to self-oscillate, cavity resonators having very high Q's are required, for example, 50,000, or higher. In such cases the resonator design is critical and operation at extremely low temperatures of the order of 4 to 77 degrees Kelvin may be necessary.

A still further type atomic or molecular resonance system comprises a pair of adjacent cavity resonators having a common apertured wall. The two resonators contain a microwave resonant gas vapor, and the wall apertures are dimensioned to permit diffusion of the gas or vapor between the resonators but preclude the direct transfer of electromagnetic energy therebetween. Microwave energy introduced into one of the resonators, which may be referred to as an excitation resonator, excites atoms or molecules therein which are in thermal equilibrium and causes them to possess oscillatory dipole moments. In the excited condition the atoms or molecules coherently radiate or emit microwave energy at a characteristic frequency of the gas or vapor. Some of these atoms or molecules freely diffuse through the apertures in the common wall between the resonators and pass into the second resonator, which may be referred to as the radiation or detection resonator. The coherent radiation of the atoms or molecules at the characteristic frequency persists in the radiation resonator until such time as the atoms or molecules strike a wall of that resonator and become thermalized. Electromagnetic oscillations begin to build up in the radiation cavity resonator as a result of energy level transitions of the atoms or molecules from the excited condition to the thermalized condition. However, the net effect of the atoms or molecules in the radiation resonator is an absorptive rather than an emissive one and sustained oscillation does not occur.

Therefore, an object of the present invention is to provide an improved atomic or molecular oscillator in which electromagnetic oscillations build up as a result of a quantum energy transition process.

Another object of the invention is to provide an improvide atomic or molecular oscillator in which electromagnetic oscillations build up as a result of a quantum energy transition process and the oscillations are sustained by means of a negative resistance effect.

Another object of the invention is to provide an improvide oscillator of the above type in which the oscillations resulting from the quantum transition process are sustained by electrical feedback.

A further object of the invention is to provide an improved atomic or molecular oscillator which does not require operation at extremely low temperatures.

A still further object of the invention is to provide an improved atomic or molecular oscillator wherein the bandwidth of the oscillator output is narrower than the usual Doppler breadth of the spectral line defined by the energy levels involved in the quantum transition process.

The foregoing and other objects and advantages are achieved in accordance with the invention in the following manner. A hollow wave energy structure such as a cavity resonator contains an atomic or molecularly resonant medium and initially produces an electromagnetic output wave at a microwave frequency at which the chosen microwave medium is resonant. This oscillatory output of the resonator is instantaneous and is caused by the energy level transition process mentioned previously. A microwave oscillator, which serves as a local oscillator, produces another output wave at a frequency near that of the instantaneous oscillatory output. The two output waves are then mixed and detected to produce a beat-frequency wave, preferably the difference modulation frequency, which may be of the order of thirty megacycles per second. The beat-frequency wave is then amplified in one or more stages of an amplifier circuit and the amplified wave appearing at its output mixed with the output of the local oscillator. The modulation frequency corresponding to the sum of the beat and local oscillator wave frequencies, assuming that the difference modulation frequency wave is amplified in the amplifier, is the same frequency instantaneously appearing at the output of the resonator containing the resonant medium and is applied to that structure in the proper phase to sustain oscillation.

The amplifier circuit amplifies the beat-frequency feedback signal to such an extent that a negative resistance effectively is applied to the resonator to produce self-oscillation.

The invention will be described in detail with reference to the accompanying drawing in which:

Figures 1 and 2 comprise a schematic cross-sectional diagram of atomic resonance apparatus, employing photon induced energy level transitions, which may be employed in the oscillator circuit of the instant invention;

Similar reference characters are applied to similar elements throughout the drawing.

Before proceeding to describe the several atomic or molecular oscillator circuits embodying the invention, several of the types of hollow wave energy structures for producing the instantaneous oscillatory output referred to previously will be described in detail.

*Optical pumping arrangement*

Figure 1:
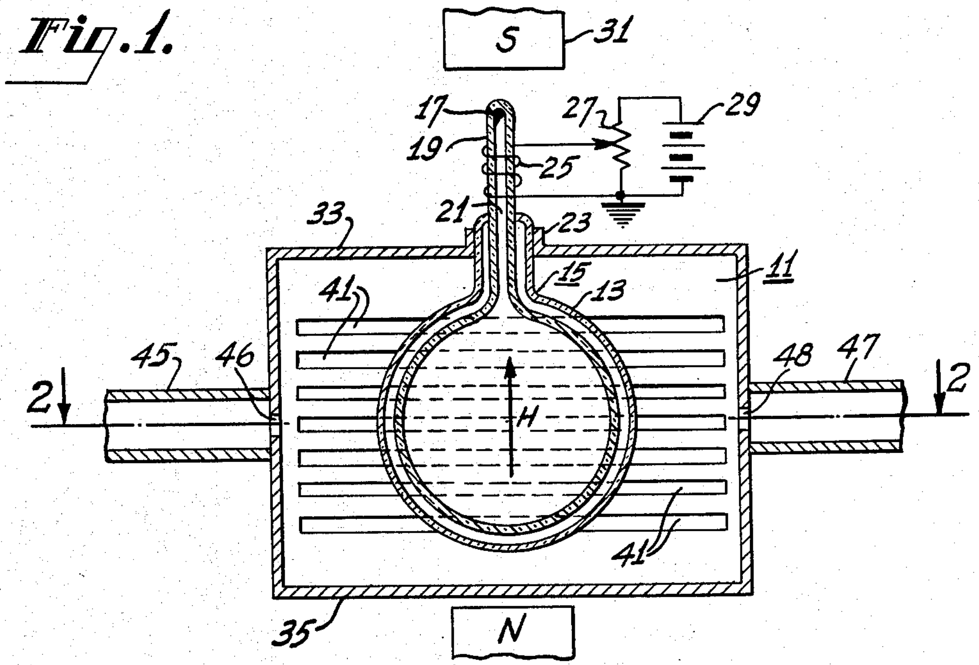
Figure 2:
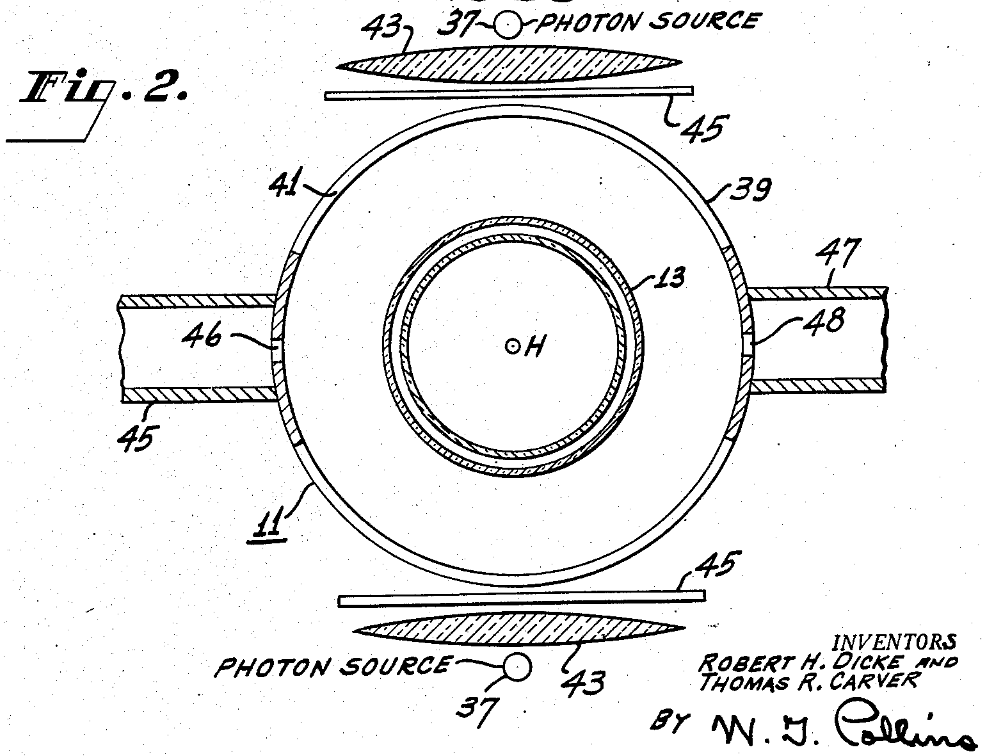

Referring to Figures 1 and 2, an arrangement employing an "optical pumping" technique is shown. A cavity resonator 11 is provided which may be operated in the $TE_{01}$ mode. The material from which the resonator 11 is formed should be non-magnetic, for example, copper or aluminum. The resonator may be cylindrical in shape and contains therein the bulb portion 13 of an envelope 15. The envelope 15 may comprise, for example, a double walled Dewar flask which contains a microwave resonant medium. The resonant medium, further by way of example, may comprise vapors such as $Na^{23}$, $Cs^{133}$, and $Rb^{87}$.

In the instant arrangement it is assumed that sodium ($Na^{23}$) has been chosen as the resonant medium. However, the other resonant media mentioned above may be used alternatively.

The metallic liquid sodium 17 is located in the neck portion 19 of the envelope 15. The neck portion 19 is outside the resonator 11 and extends into the resonator through an aperture 21 and collar 23 in the top wall of the resonator. A heating element 25 is disposed about the neck portion 19 near the top thereof and is supplied with current by a potentiometer 27 and battery 29. Adjustment of the position of the potentiometer arm causes an increase or a decrease in the current flowing through the heater element 25 and thereby either increases or decreases the pressure of the sodium vapor in the bulb portion 13. In the present example the sodium vapor pressure preferably is between $10^{-5}$ and $10^{-7}$ millimeters of mercury.

The foregoing arrangement for heating the vapor is merely for purpose of illustration. Other methods of heating the envelope may be employed alternatively. In some instances it may be permissible to heat both the envelope and the cavity resonator.

A D.-C. magnetic field is impressed on the vapor by means of a permanent magnet 31, or by electromagnetic means if more convenient. The magnetic field may be approximately 0.1 gauss and is for the purpose of resolving the degeneracy of the magnetic substates of the sodium vapor. The magnetic lines of force H are perpendicular to the top and bottom resonator walls 33 and 35.

The microwave resonant medium located within the resonator 11 is irradiated or illuminated with photon energy produced by one or more photon sources 37. The sources 37 comprise sodium-D lamps which are commercially available. It should be pointed out, however, that if a resonant medium other than sodium is contained in the resonator 11, a different type lamp is required. For example, if cesium is employed as the resonant medium, a cesium lamp is required to provide the requisite photon excitation.

It is preferred to irradiate the resonant medium through the resonator side wall 39. The resonator 11, in such case, includes a plurality of slots 41, for example, two, each of which encompasses an angle of about 150° to 160° about the periphery of the wall 39. When a resonator having two rows of slots is employed, it further is preferred, although not essential, to utilize two photon sources, one source being adjacent each slotted wall section. A lens 43 and a Polaroid screen 45 are disposed between each photon source 37 and the resonator wall. The Polaroid screen 45 preferably is oriented so that the electric vector of the photon energy incident on the vapor is parallel to the magnetic lines of force H. In the event the geometry of the resonator structure is such that it is difficult for the lenses 43 to properly focus the photon energy and direct it over a wide angle, it may be desirable to omit the lenses and employ reflector type mirrors. In such case the photon sources 37 are located between the wall 39 and the mirrors.

Input and output waveguide sections 45 and 47, respectively, are provided having coupling irises 46 and 48 for coupling microwave energy into and out of the resonator, respectively, at frequencies at which the medium is resonant. Although separate input and output guide sections are illustrated, in certain instances one of the waveguide sections may be omitted and a single waveguide section may be used for both introducing electromagnetic energy into and withdrawing electromagnetic energy from the resonator.

*Operation of optical pumping arrangement*

The operation of the structure illustrated in Figure 1 is believed to be as follows. The sodium atoms initially are in thermal equilibrium in a $3S_{1/2}$ ground state. The photon energy of the sodium-D lamp is just sufficient to excite the microwave resonant vapor in the envelope 15 to disturb the thermal equilibrium condition and induce certain permitted energy level transitions from magnetic substates of the $F=1$ level of the $3S_{1/2}$ ground state to magnetic substates of the $F=2$ level of the $3P_{1/2}$ excited state. These photon induced transitions are followed by spontaneous "drop-down" transitions to all the magnetic substates of the $F=1$ level of the $3S_{1/2}$ ground state.

The net result of foregoing transition processes is that the $M_F=0$ magnetic substate of the $F=2$ level of the $3S_{1/2}$ state has a higher occupation probability (0.163) than the $M_F=0$ magnetic substate (0.137) of the $F=1$ level of the $3S_{1/2}$ state. This means that the vapor is in what may be termed a condition of "negative attenuation." In such condition the atoms of the vapor coherently radiate or emit energy at a frequency defined by the two $M_F=0$ substates. The intensity of the coherent radiation or emission is sufficient to produce an instantaneous oscillatory output wave in the output waveguide section 47 at the resonant frequency of the vapor. However, for the reasons heretofore mentioned, the intensity of the coherent radiation is not sufficient for the structure per se to produce sustained oscillations.

If desired, the oscillatory output transmitted through the waveguide section 47 may be modulated by modulating the output of the photon sources 37. This conveniently may be accomplished by interrupting the filament current to the sodium-D lamps.

*Two-chamber diffusion arrangement*

Figures 3, 4, 5:
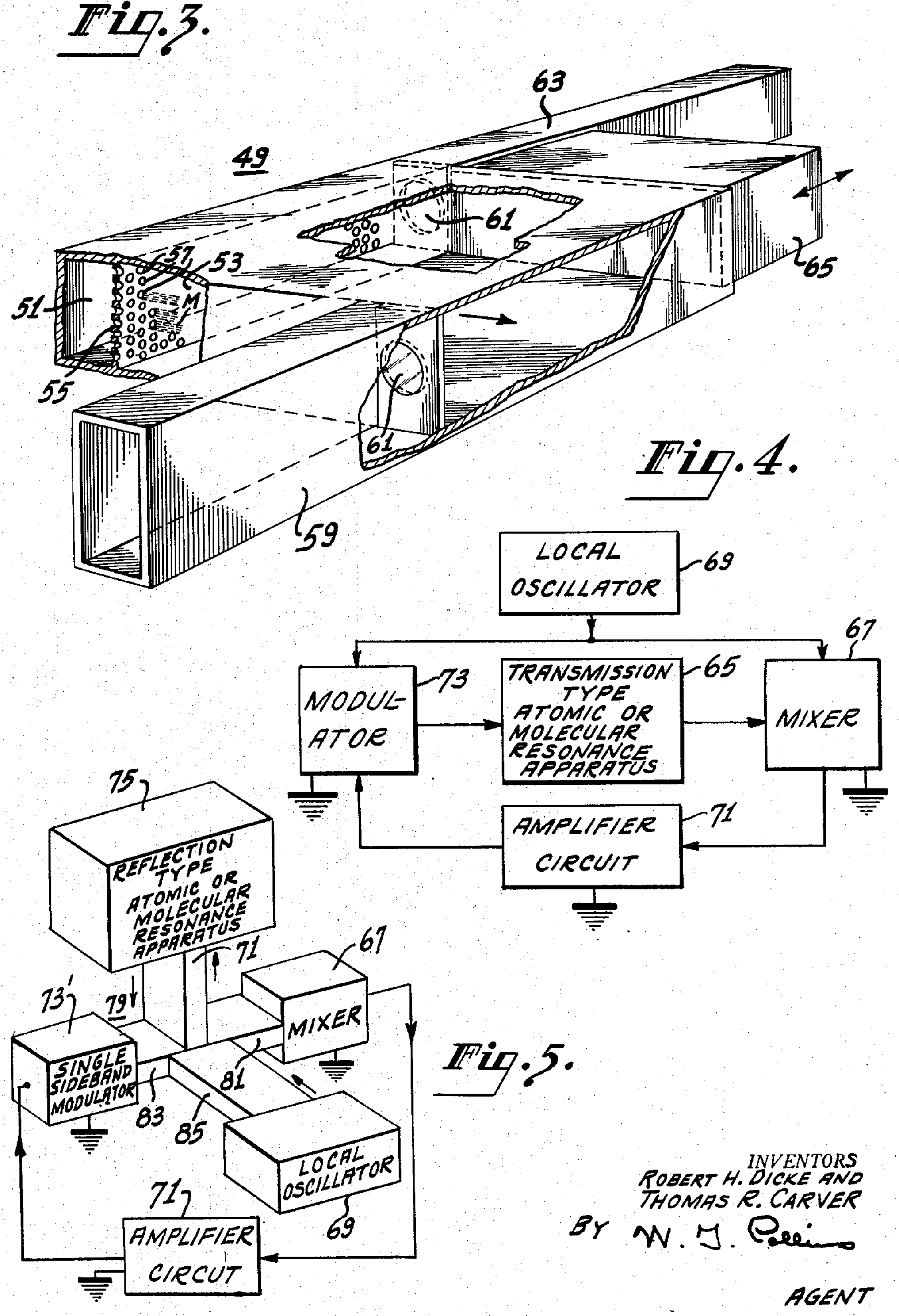
Figure 3 is a schematic diagram of molecular resonance apparatus, employing molecular diffusion, which may be utilized in the oscillator circuit of the invention.
Figure 4 is a schematic diagram in block form, of an embodiment of the invention which employs a transmission type hollow wave energy structure.
Figure 5 is a schematic diagram of another embodiment of the invention which employs a reflection type hollow wave energy structure and single sideband modulation.

In Figure 3 a gas chamber 49 comprises two cavity resonators 51 and 53 having a common apertured wall 55. The wall 55 precludes any appreciable direct transfer of electromagnetic energy from resonator 51 to resonator 53, but permits diffusion of gas molecules between the two resonators. The gas confined in the chamber is a molecularly resonant gas and is at a low pressure, for example, 0.01 millimeter of mercury or less. In such case the mean free path of the gas molecules is of the order of the chamber dimensions. The gas may be ammonia, ethylchloride, ethyl oxide, carbonyl sulfide, or other gases whose molecules have oscillatory dipole moments excited when the gas is subjected to microwave energy.

For purpose of explanation, it is assumed that a molecule M is in the resonator 51, the excitation resonator, and is moving to the right just after having collided with the left-hand wall of the resonator 51. After such collision the molecule is in thermal equilibrium. In continuing its movement to the right toward the apertured wall 55, the molecule is excited into a state for which it possesses an oscillatory electric dipole moment, the dipole moment oscillating at a natural frequency characteristic of the gas. Such excitation initially may occur in response to a noise transient at the proper frequency. The oscillation of the molecule M continues during its passage through an aperture in the wall 55 and persists in the resonator 53, referred to as the radiation resonator, until the molecule strikes the far wall of that resonator. The spacing between the apertured wall 55 and the far wall defining the radiation resonator 53 is made many times $\lambda$, for example $10\lambda$, where $\lambda$ is a wavelength at the resonant frequency at the gas. Since all the gas molecules in the excitation resonator 51 take approximately the same time to cross the resonator before they pass through the diffusion wall 55, substantially all the molecules are excited to the oscillatory state and oscillate in phase.

The axially aligned passages in the wall 55 collimate the excited molecules into a radiating beam. This is because those molecules which collide with the side walls of the apertures are returned to the non-oscillatory state and do not radiate in the radiation resonator. The only molecules which are in condition to radiate in the radiation resonator 53 are those which diffuse freely through the apertures or passages 57. These molecules form a well-defined beam in which the molecules are oscillating in phase with a polarization parallel to their direction of motion. As all the radiating molecules in the resonator 53 are moving in the same direction toward the far wall of the resonator, they all travel a substantial distance before colliding with that wall and radiate during many cycles of their molecular resonant frequency. These molecules, therefore, serve as a coherent signal source sharply tuned to the resonant frequency of the molecules. The coherent radiation results in an instantaneous oscillatory output at this frequency which may be transmitted through an output waveguide 59. However, the aggregate of molecules in the resonator 53, in both the oscillatory and non-oscillatory states, is such that self-oscillation does not occur.

The gas may be confined within the two resonators 51 and 53 comprising the chamber 49 by plates having windows 61 of mica or other suitable material which is impervious to the gas but substantially transparent to microwave energy. One of the windows 61 is at the receiving end of the output waveguide 59 while the other window 61 is at the delivery end of an input waveguide section 63 connected to the excitation resonator 51. The radiation resonator 53 preferably is tunable by a plunger 65 so that the resonator 53 is excited by the gas radiation signal in the mode for which the electric field is parallel to the path of the radiating molecules. The sliding contact between the plunger 65 and the resonator walls may be made gas-tight by known techniques.

The two-chamber diffusion arrangement decribed above also is applicable to a situation where an atomic rather than a molecular beam is produced. For example, a cesium beam may be generated in an oven of known type with the beam successively passing through the resonators 51 and 53. In such case the wall of resonator 51 adjacent the oven should be apertured to permit entry of the beam into the resonator.

*Doppler line-breadth reduction*

It has been found that the Doppler breadth of the spectral line defined by the energy levels between which transitions occur may result in a relatively wideband oscillatory output from the structures of Figures 1 through 3. In order to insure oscillation within a sharp, narrow band of frequencies a small quantity of a buffer gas, for example, a noble gas such as helium or argon, may be introduced into the chamber containing the microwave resonant medium and mixed therewith. The partial pressure of the noble gas preferably is several orders of magnitude greater than the partial pressure of the resonant medium, for example, one millimeter of mercury. The atoms of the noble gas effectively provide a long diffusion time for the atoms or molecules of the resonant medium before they strike the walls of the chamber within which they are located. This is because the resonant atoms or molecules strike the noble gas atoms before they strike the chamber walls.

For the particular microwave resonance associated with sodium, hydrogen, and a number of other microwave resonant materials, the collision between an atom or molecule of the resonant medium and an atom of the noble gas causes negligible disturbances to the resonating atom or molecule. On the other hand a collision between two atoms or molecules of the resonating medium does disturb the resonance. Consequently, to achieve a sharp resonance a long uninterrupted resonance period is desirable for the resonating atoms or molecules. This necessitates a low concentration of atoms or molecules of the resonant medium, as well as a long diffusion time to the chamber walls.

*Atomic or molecular oscillator circuits*

Figure 4 shows a first embodiment of the invention in which a transmission type atomic or molecular resonance apparatus 65 is employed, i. e., a structure having separate input and output connections. Such structure may comprise, for example, the optical pumping arrangement of Figures 1 and 2 where the input connection is the waveguide section 45 and the output connection is the waveguide section 47, or the two-chamber diffusion arrangement of Figure 3 where the input connection is the waveguide section 63 and the output connection is the waveguide section 59, or another transmission type atomic or molecular resonance structure capable of producing an instantaneous oscillatory output in response to the occurrence of energy level transitions.

The instantaneous microwave output at a resonance frequency of the microwave resonant medium is coupled from the output connection of the apparatus 65 and is applied to a mixer 67. The output of a reasonably stable microwave local oscillator 69, such as a klystron, also is applied to the mixer 67. The mixer 67 may be a crystal rectifier and produces at its output a modulation wave having a frequency equal to the difference between the frequency of the instantaneous output and the local oscillator frequency. The difference modulation frequency may be 30 megacycles per second, for example, and this wave is applied to the input of an amplifier circuit 71. The amplifier bandpass characteristic is not critical, but preferably the bandwidth of the amplifier 71 should be greater than the stability of the local oscillator 69. The output of the amplifier circuit 71 is then applied to a modulator 73 which, like the mixer 67, may be a crystal rectifier. The output of the local oscillator 69 also is applied to the modulator. The modulator 73 produces an output wave having a frequency which is the sum of the frequencies of the input waves applied thereto. It is to be noted that this wave is at the same frequency as the instantaneous output wave produced by the apparatus 65. The output of the modulator 73 therefore may be applied to the input connection of the apparatus 65 to sustain the instantaneous oscillator output.

The gain in the feedback loop including the amplifier circuit 71 is adjusted so that a negative resistance effectively is applied to the input connection of the apparatus 65 to produce self-oscillation.

In Figure 5 another embodiment of the invention is shown which employs a reflection type atomic or molecular resonance apparatus 75. This structure has a single connection means which serves both as an input and an output connection. By way of example, the structure may comprise the optical pumping arrangement of Figures 1 and 2 with the waveguide section 45 omitted. In this embodiment of the invention the instantaneous output of the reflection type apparatus is coupled though one of the asymmetrical arms 77 of a magic-T 79 and into both its symmetrical side arms 81 and 83. The local oscillator 69 is connected to the other asymmetric arm 85 of the magic-T 79 which preferably includes an attenuator (not shown) for reducing the level of the local oscillator energy. The local oscillator energy also is coupled into both side arms 81 and 83.

The side arms 81 and 83 are connected to a mixer 67 and a single sideband modulator 73′, respectively. The single sideband modulator 73′ may be of the type described in Patent No. 2,496,521, granted to R. H. Dicke on February 7, 1950. The mixer 67 is responsive to the outputs of the reflection apparatus 75 and local oscillator 69 to produce the 30 megacycle per second wave mentioned previously. This 30 megacycle per second wave is amplified in an amplifier circuit 71 connected between the mixer 67 and the modulator 73′. In the modulator 73′ the amplified 30 megacycle per second wave and the local oscillator wave energy are combined to produce a sideband at the resonance frequency of the microwave resonant medium. This sideband is propagated through the side arm 83 and the asymmetric arm 77 to the single connection of the apparatus 75 to sustain its oscillatory output.

Figures 6, 7, 8, 9, 10:
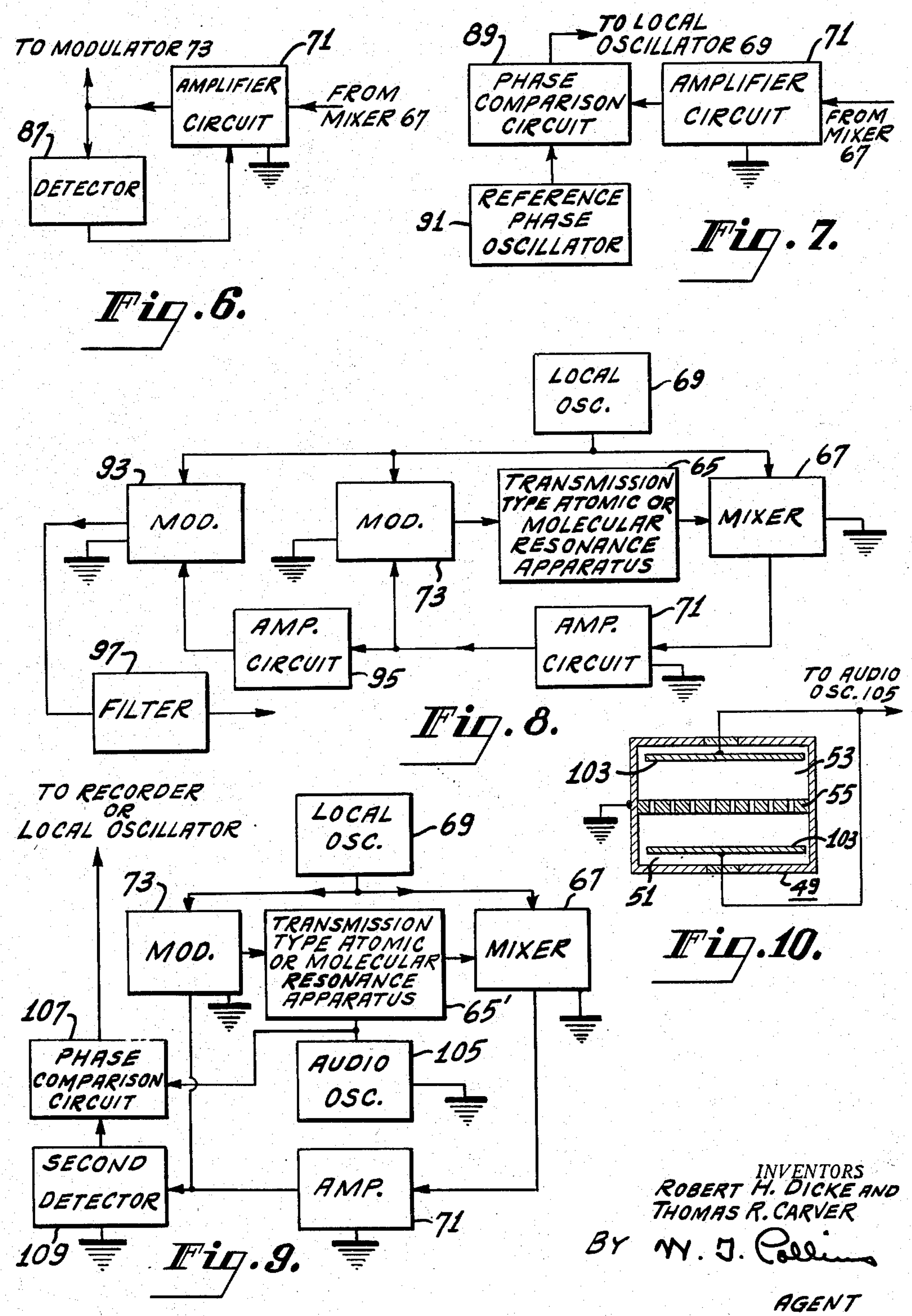
Figure 6 is a schematic diagram of an automatic gain control circuit for use in connection with the invention.
Figure 7 is a schematic diagram of a phase-lock circuit for use in connection with the invention.
Figure 8 is a schematic diagram of a further embodiment of the invention which produces an output wave at a relatively high power level.
Figure 9 is a schematic diagram of a further embodiment of the invention in which a Stark field is applied to a microwave resonant medium.
Figure 10 illustrates a hollow wave energy structure containing Stark electrodes for use in the circuit of Figure 9.

In order to obviate the undesirable effect of saturating the microwave resonant medium employed in the atomic or molecular oscillator circuit, it is desirable to control the strength of the electromagnetic field established within the hollow wave structure containing the medium. If the electromagnetic field strength is too great, saturation broadening of the spectral line of interest occurs as well as other undesirable effects. Control of the field strength is achieved in accordance with a further feature of the invention by providing an automatic gain control circuit in the feedback loop. This circuit is illustrated in Figure 6 where a portion of the amplified energy appearing at the output of the amplifier 71 is impressed on a detector 87. The output of the detector 87 comprises a direct-current voltage having an amplitude which is proportional to the amplitude of the amplifier output. The direct-current voltage is applied to one or more input circuits of the amplifier 71 to automatically control its gain in a well-known manner.

Figure 7 shows a circuit for phase-locking the local oscillator 69. Control of the phase of the local oscillator energy affords improved circuit operation where high short term oscillator stability is desired. Phase locking the local oscillator also permits use of a narrower band amplifier in the feed-back loop, thereby providing an improved signal-to-noise ratio. In Figure 7 a portion of the output of the amplifier circuit 71 is applied to one input circuit of a phase comparison circuit 89. The other input circuit of the comparison circuit 89 has applied thereto the output of a reference phase oscillator 91, such as a crystal oscillator, which is at the same frequency as the energy transmitted through the feedback loop. The comparison circuit 89 produces a control effect which varies in sense and magnitude in accordance with phase or frequency of the local oscillator. This control effect is applied to a frequency control electrode of the local oscillator 69 to lock its phase. In the case of the klystron type local oscillator, the control effect may be applied to its reflector or repeller electrode.

Provided the reference phase oscillator 91 has the desired degree of stability, the klystron local oscillator 69 has the same stability as the signal appearing at the output of the resonance cell. In such case the local oscillator output, which is at a high power level compared to the output of the resonance cell, may be utilized as the ultimate output of the system. The frequency of this output, of course, is displaced from the resonance frequency by the frequency of the energy transmitted in the feedback loop.

In Figure 8 another embodiment of the invention is shown which is useful in producing at a relatively high power level a stable output wave at a resonant frequency of the medium employed. This circuit includes the basic circuit elements described previously with reference to Figure 4, and also includes an additional modulator 93, an additional amplifier 95, and a filter 97. The amplifier 95 is coupled to receive a portion of the feedback energy available at the output of the amplifier 71 in the feedback loop. The amplifier 95 amplifies this energy portion to a high level and then impresses it on the modulator 93. The modulator 93 also has applied to it a portion of the output of the relatively high power local oscillator 69. The output of the modulator 93 includes upper and lower sidebands. The filter 97 is coupled to receive the output of the modulator 93 and is designed to pass only the sideband having the frequency which corresponds to the resonant frequency of the microwave resonant medium.

Figure 9 shows a further embodiment of the invention which is useful for microwave spectroscopy and other purposes. The circuitry employed in some respects is similar to that described with reference to Figure 4. For purpose of illustration the atomic or molecular resonance apparatus 65′ may be of the two-chamber molecular diffusion type shown in Figure 3. However, means is provided for shifting the frequency of resonance of the microwave resonant medium located in the chamber. Referring to Figure 10, such means comprises a pair of Stark electrodes 103, insulated from the walls of the chamber 49 with one electrode being located in each of the resonators 51 and 53. It is assumed here that the resonant gas is one having an appreciable electric dipole moment. The Stark field is established by applying to the electrodes 103 a potential from an audio oscillator 105.

Referring again to Figure 9, the output of the audio oscillator 105 may comprise an audio signal of from 30 cycles per second to 100 kilocycles per second superimposed on a direct-current voltage component. The superimposed outputs are applied to the electrodes 103 to apply a Stark field to the gas. The alternating-current component of the Stark modulation wave is applied to one input circuit of a phase comparison circuit 107. A second detector 109 is connected to the output circuit of the amplifier 71 to separate the audio component from the 30 megacycle per second wave transmitted in the feedback loop. The second detector output is applied to the remaining input circuit of the phase comparison circuit 107. The output of the circuit 107 comprises a direct-current voltage which is indicative of the fact that a microwave resonance has been located. Such direct-current voltage may be applied to a recorder (not shown), if desired, to provide a permanent record of the gas analysis. Alternatively, where microwave spectroscopy is not desired, the direct-current voltage may be applied to a frequency control electrode of the local oscillator 69 to control its frequency so that the circuit may oscillate at a frequency corresponding to the frequency of a relatively weak resonance line.

Although the foregoing description has been directed to an arrangement employing Stark effect, a Zeeman field may be used alternatively where a gas or vapor having a magnetic dipole moment is employed.

What is claimed is:

1. A microwave oscillator circuit comprising a hollow wave energy structure containing a microwave resonant medium capable of producing an instantaneous oscillatory output at a frequency at which said medium is resonant, an oscillator for producing an output wave at a frequency different from said resonant frequency, a mixer coupled to said hollow wave energy structure and said oscillator for producing a modulation frequency wave, an amplifier circuit having its input circuit connected to the output of said mixer, a modulator, and means for applying the output of said amplifier circuit and the output of said oscillator to said modulator to produce an output wave at said resonant frequency for application to said hollow wave energy structure to sustain said oscillatory output.

2. A microwave oscillator circuit comprising, a hollow wave energy structure containing a microwave resonant medium capable of producing an instantaneous oscillatory output at a frequency at which said medium is resonant, an oscillator for producing an output wave at a frequency different from said resonant frequency, a mixer coupled to said hollow wave energy structure and said oscillator for producing a difference frequency modulation wave, an amplifier circuit having its input circuit connected to the output of said mixer, a modulator, and means for applying the output of said amplifier circuit and the output of said oscillator to said modulator to produce an output wave at said resonant frequency for application to said hollow wave energy structure to sustain said oscillatory output.

3. A microwave oscillator circuit comprising, a hollow wave energy structure having separate input and output connection means, a microwave resonant medium within said hollow structure capable of producing an instantaneous oscillatory output at a frequency at which said medium is resonant, an oscillator for producing an output wave at a frequency different from said resonant frequency, a mixer coupled to the output connection means of said hollow energy structure and to said oscillator for producing a modulation frequency wave, an amplifier circuit having its input circuit connected to the output of said mixer, a modulator, means for applying the output of said amplifier circuit and the output of said oscillator to said modulator to produce at the output of said modulator a wave at said resonant frequency, and means for applying the output of said modulator to the input connection means of said hollow wave energy structure to sustain said oscillatory output.

4. A microwave oscillator circuit comprising, a hollow wave energy structure having separate input and output connection means, a microwave resonant medium within said hollow structure capable of producing an instantaneous oscillatory output at a frequency at which said medium is resonant, an oscillator for producing an output wave at a frequency different from said resonant frequency, a mixer coupled to the output connection means of said hollow wave energy structure and to said oscillator for producing a difference frequency modulation wave, an amplifier circuit having its input circuit connected to the output of said mixer, a modulator, means for applying the output of said amplifier circuit and the output of said oscillator to said modulator to produce at the output of said modulator a sum frequency modulation wave at said resonant frequency, and means for applying the output of said modulator to the input connection means of said hollow wave energy structure to sustain said oscillatory output.

5. A microwave oscillator circuit comprising, a hollow wave energy structure containing a microwave resonant medium capable of producing an instantaneous oscillatory output at a frequency at which said medium is resonant, an oscillator for producing an output wave at a frequency different from said resonant frequency, a mixer coupled to said hollow wave energy structure and said oscillator for producing a modulation frequency wave, an amplifier circuit having its input circuit connected to the output of said mixer, a modulator, means for applying the output of said amplifier circuit and the output of said oscillator to said modulator to produce an output wave at said resonant frequency for application to said hollow wave energy structure to sustain said oscillatory output, an additional amplifier circuit connected to the output circuit of said first-named amplifier circuit for amplifying the output of said first-named amplifier circuit to a high level, an additional modulator connected to receive the outputs of said oscillator and said additional amplifier, and a filter connected to the output of said additional modulator for passing only the sideband corresponding to said resonant frequency.

6. A microwave oscillator circuit comprising, a hollow wave energy structure containing a microwave resonant medium capable of producing an instantaneous oscillatory output at a frequency at which said medium is resonant, an oscillator for producing an output wave at a frequency different from said resonant frequency, a mixer coupled to said hollow wave energy structure and said oscillator for producing a modulation frequency wave, an amplifier circuit having its input circuit connected to the output of said mixer, a modulator, means for applying the output of said amplifier circuit and the output of said oscillator to said modulator to produce an output wave at said resonant frequency for application to said hollow wave energy structure to sustain said oscillatory output, means for applying an alternating-current field to said medium for shifting its resonance frequency, a detector coupled to receive a portion of the output of said amplifier circuit, a phase comparison circuit having one input circuit connected to the output of said detector and its remaining input circuit coupled to receive a portion of the energy of said alternating-current field, and means for utilizing the output of said phase comparison circuit.

7. A microwave oscillator circuit comprising, a hollow wave energy structure having a connection means both for introducing energy into and withdrawing energy from said structure, a microwave resonant medium within said hollow structure capable of producing an instantaneous oscillatory output at said connection means at a frequency at which said medium is resonant, an oscillator for producing an output wave at a frequency different from said resonant frequency, a mixer coupled to said hollow wave energy structure and to said oscillator for producing a modulation frequency wave, an amplifier circuit having its input circuit connected to the output of said mixer, a modulator, means for applying the output of said amplifier circuit and the output of said oscillator to said modulator to produce at the output of said modulator a wave at said resonant frequency for application to the connection means of said hollow wave energy structure to sustain said oscillatory output.

8. A microwave oscillator circuit comprising, a hollow wave energy structure having a connection means for both introducing electromagnetic wave energy into and withdrawing electromagnetic wave energy from said structure, a microwave resonant medium within said hollow structure capable of producing an instantaneous oscillatory output at said connection means at a frequency at which said medium is resonant, a magic-T, means for coupling said instantaneous oscillatory output to a first arm of said magic-T, an oscillator for producing an output wave at a frequency different from said resonant frequency, means for applying the output of said oscillator to a second arm of said magic-T which is decoupled with respect to said first arm, a mixer coupled to a third arm of said magic-T responsive to said instantaneous oscillatory output and to the output of said oscillator for producing a modulation frequency wave, an amplifier circuit having its input circuit connected to the output of said mixer, a single sideband modulator coupled to a fourth arm of said magic-T, and means for applying the output of said amplifier circuit to said single sideband modulator to produce an output wave at said resonant frequency to sustain said oscillatory output.

9. A microwave oscillator circuit comprising, a hollow wave energy structure containing a microwave resonant medium capable of producing an instantaneous oscillatory output at a frequency at which said medium is resonant, an oscillator for producing an output wave at a frequency different from said resonant frequency, a mixer coupled to said hollow wave energy structure and said oscillator for producing a modulation frequency wave, an amplifier circuit having its input circuit connected to the output of said mixer, a modulator, means for applying the output of said amplifier circuit and the output of said oscillator to said modulator to produce an output wave at said resonant frequency for application to said hollow wave energy structure to sustain said oscillatory output, an automatic gain control circuit having an input circuit connected to receive a portion of the output of said amplifier circuit to produce a direct-current voltage and an output circuit connected to apply said direct-current voltage to said amplifier circuit to maintain the amplitude of its output substantially constant.

10. A microwave oscillator circuit comprising, a hollow wave energy structure containing a microwave resonant medium capable of producing an instantaneous oscillatory output at a frequency at which said medium is resonant, an oscillator for producing an output wave at a frequency different from said resonant frequency, a mixer coupled to said hollow wave energy structure and said oscillator for producing a modulation frequency wave, an amplifier circuit having its input circuit connected to the output of said mixer, a modulator, means for applying the output of said amplifier circuit and the output of said oscillator to said modulator to produce at its output a wave at said resonant frequency for application to said hollow wave energy structure to sustain said oscillatory output a phase comparator having two input circuits, a reference phase oscillator generating a wave at said modulation frequency coupled to one of said two input circuits, and means for coupling the output of said amplifier to the other input circuit of said comparator to produce a control voltage at the output of said phase comparator for phase-locking said oscillator.

11. A microwave oscillator circuit comprising, a hollow wave energy structure containing a microwave resonant medium capable of producing an instantaneous oscillatory output at a frequency at which said medium is resonant, an oscillator for producing an output wave at a frequency different from said resonant frequency, a mixer coupled to said hollow wave energy structure and said oscillator for producing a modulation frequency wave, an amplifier circuit having its input circuit connected to the output of said mixer, a modulator, means for applying the output of said amplifier circuit and the output of said oscillator to said modulator to produce at its output a wave at said resonant frequency for application to said hollow wave energy structure to sustain said oscillatory output, a phase comparator having two input circuits, a reference phase oscillator generating a wave at said modulation frequency coupled to one of said two input circuits, means for coupling the output of said amplifier circuit to the other input circuit of said comparator to produce a control voltage for phase-locking said oscillator, and an automatic gain control circuit having an input circuit connected to receive a portion of the output of said amplifier circuit to produce a direct-current voltage and an output circuit connected to apply said direct-current voltage to said amplifier circuit to maintain the amplitude of its output substantially constant.

12. A microwave oscillator circuit comprising, a photon source, a hollow wave energy structure containing a microwave resonant medium responsive to photon energy produced by said source for producing at the output of said hollow structure an instantaneous oscillatory output at a frequency at which said medium is resonant, an oscillator for producing an output wave at a frequency different from said resonant frequency, a mixer coupled to said hollow wave energy structure and said oscillator for producing a modulation frequency wave, an amplifier circuit having its input circuit connected to the output of said mixer, a modulator, and means for applying the output of said amplifier circuit and the output of said oscillator to said modulator to produce an output wave at said resonant frequency for application to said hollow wave structure to sustain said oscillatory output.

13. A microwave oscillator circuit comprising, a hollow wave energy structure containing a microwave resonant medium, means for applying a magnetic field to said medium, a photon source for producing photon energy for irradiating said medium to produce at the output of said hollow structure an instantaneous oscillatory output at a frequency at which said medium is resonant, an oscillator for producing an output wave at a frequency different from said resonant frequency, a mixer coupled to said hollow wave energy structure and said oscillator for producing a modulation frequency wave, an amplifier circuit having its input circuit connected to the output of said mixer, a modulator, and means for applying the output of said amplifier circuit and the output of said oscillator to said modulator to produce an output wave at said resonant frequency for application to said hollow wave structure to sustain said oscillatory output.

14. A microwave oscillator circuit comprising a photon source, a cavity resonator containing a microwave resonant medium responsive to photon energy produced by said source for producing at the output of said cavity resonator an instantaneous oscillatory output at a frequency at which said medium is resonant, an oscillator for producing an output wave at a frequency different from said resonant frequency, a mixer coupled to said cavity resonator and said oscillator for producing a modulation frequency wave, an amplifier circuit having its input circuit connected to the output of said mixer, a modulator, and means for applying the output of said amplifier circuit and the utput of said oscillator to said modulator to produce an output wave at said resonant frequency for application to said cavity resonator to sustain said oscillatory output.

15. A microwave oscillator circuit comprising a cavity resonator containing a microwave resonant medium, means for applying a magnetic field to said medium, a photon source for producing photon energy for irradiating said medium to produce at the output of said cavity resonator an instantaneous oscillatory output at a frequency at which said medium is resonant, an oscillator for producing an output wave at a frequency different from said resonant frequency, a mixer coupled to said cavity resonator and said oscillator for producing a modulation frequency wave, an amplifier circuit having its input circuit connected to the output of said mixer, a modulator, and means for applying the output of said amplifier circuit and the output of said oscillator to said modulator to produce an output wave at said resonant frequency for application to said cavity resonator to sustain said oscillatory output.

16. A microwave oscillator circuit comprising, a cavity resonator having separate input and output connections, a microwave resonant medium within said cavity resonator, means for applying a magnetic field to said medium, a photon source for irradiating said medium with photon energy whereby said cavity resonator produces an instantaneous oscillatory output at said output connection at a frequency at which said medium is resonant, an oscillator for producing an output wave at a frequency different from said resonant frequency, a mixer coupled to the output connection of said hollow wave energy structure and to said oscillator for producing a modulation frequency wave, an amplifier circuit having its input circuit connected to the output of said mixer, a modulator, means for applying the output of said amplifier circuit and the output of said oscillator to said modulator to produce at the output of said modulator a wave at said resonant frequency, and means for applying the output of said modulator to the input connection of said cavity resonator to sustain said oscillatory output.

17. A microwave oscillator circuit comprising, a cavity resonator containing a microwave resonant medium, means for applying a magnetic field to said medium, means including a photon source for irradiating said medium with photon energy having an electric vector parallel to the lines of force of said magnetic field whereby said cavity resonator produces an instantaneous oscillatory output at a frequency at which said medium is resonant, an oscillator for producing an output wave at a frequency different from said resonant frequency, a mixer coupled to said cavity resonator and said oscillator for producing a modulation frequency wave, an amplifier circuit having its input circuit connected to the output of said mixer, a modulator, and means for applying the output of said amplifier circuit and the output of said oscillator to said modulator to produce an output wave at said resonant frequency for application to said cavity resonator to sustain said oscillatory output.

18. A microwave oscillator circuit comprising, a hollow wave energy structure containing a molecularly resonant gas including two chambers having a common wall with apertures in said wall permitting diffusion of molecules of said gas between said chamber but precluding the direct transfer of electromagnetic energy between said chambers, one of said chambers providing an instantaneous oscillatory output at a frequency at which said molecules are resonant, an oscillator for producing an output wave at a frequency different from said resonant frequency, a mixer responsive to said instantaneous oscillatory output and to the output of said oscillator for producing a modulation frequency wave, an amplifier circuit having its input circuit connected to the output of said mixer, a modulator, means for applying the output of said amplifier circuit and the output of said oscillator to said modulator to produce at the output of said modulator a wave at said resonant frequency, and means for applying the output of said modulator to the other of said chambers to sustain said oscillatory output in said one chamber.

19. A microwave oscillator circuit comprising, a hollow wave energy structure containing a molecularly resonant gas including two chambers having a common wall with apertures in said wall permitting diffusion of molecules of said gas between said chamber but precluding the direct transfer of electromagnetic energy between said chambers, one of said chambers providing an instantaneous oscillatory output at a frequency at which said molecules are resonant, an oscillator for producing an output wave at a frequency different from said resonant frequency, a mixer responsive to said instantaneous oscillatory output and to the output of said oscillator for producing a modulation frequency wave, an amplifier circuit having its input circuit connected to the output of said mixer, a modulator, means for applying the output of said amplifier circuit and the output of said oscillator to said modulator to produce at the output of said modulator a wave at said resonant frequency, means for applying the output of said modulator to the other of said chambers to sustain said oscillatory output in said one chamber, means for applying an alternating-current field to said gas for shifting the resonance frequency of its molecules, a detector coupled to receive a portion of the output of said amplifier circuit, a phase comparison circuit having one input circuit connected to the output of said detector and its remaining input circuit connected to receive a portion of the energy of said alternating-current field, and means for utilizing the output of said phase comparison circuit.

20. A microwave oscillator circuit comprising, a hollow wave energy structure containing a molecularly resonant gas including two chambers having a common wall with apertures in said wall permitting diffusion of molecules of said gas between said chamber but precluding the direct transfer of electromagnetic energy between said chambers, one of said chambers providing an instantaneous oscillatory output at a frequency at which said molecules are resonant, an oscillator for producing an output wave at a frequency different from said resonant frequency, a mixer responsive to said instantaneous oscillatory output and to the output of said oscillator for producing a modulation frequency wave, an amplifier circuit having its input circuit connected to the output of said mixer, a modulator, means for applying the output of said amplifier circuit and the output of said oscillator to said modulator to produce at the output of said modulator a wave at said resonant frequency, means for applying the output of said modulator to the other of said chambers to sustain said oscillatory output in said one chamber, means for applying a Stark field to said gas for shifting the resonance frequency of its molecules, a detector coupled to receive a portion of the output of said amplifier circuit, a phase comparison circuit having one input circuit connected to the output of said detector and its remaining input circuit connected to receive a portion of the energy of said Stark field, and means for utilizing the output of said phase comparison circuit.

21. A microwave oscillator circuit comprising, a hollow wave energy structure containing a microwave resonant medium within said hollow structure capable of producing an instantaneous oscillatory output at a frequency at which said medium is resonant, means for producing an output wave at a frequency different from said resonant frequency, means for combining said instantaneous oscillatory output and said output wave at said different frequency to produce a modulation frequency wave, means for amplifying said modulation frequency wave, and means for combining said amplified modulation frequency wave and said output wave at said different frequency to produce an output wave at said resonant frequency for application to said hollow wave energy structure to sustain said oscillatory output.

22. A microwave oscillator circuit comprising, a hollow wave energy structure having separate input and output connection means, a microwave resonant medium within said hollow structure capable of producing an instantaneous oscillatory output at a frequency at which said medium is resonant, means for producing an output wave at a frequency different from said resonant frequency, combining means coupled to the output connection means of said hollow wave energy structure and to said means for producing said output wave at said different frequency for producing a modulation frequency wave, means for amplifying said modulation frequency wave, means for combining said amplified modulation frequency wave and said output wave at said different frequency to produce a wave at said resonant frequency, and means for applying the wave at said resonant frequency resulting from said combining to the input connection means of said hollow wave energy structure to sustain said oscillatory output.

23. A microwave oscillator circuit comprising, a hollow wave energy structure having a connection means both for introducing energy to and withdrawing energy from said structure, a microwave resonant medium within said hollow structure capable of producing an instantaneous oscillatory output at a frequency at which said medium is resonant, means for producing an output wave at a frequency different from said resonant frequency, combining means coupled to the connection means of said hollow wave structure and to said means for producing said output wave at said different frequency for producing a modulation frequency wave, means for amplifying said modulation frequency wave, and means for combining said amplified modulation frequency wave and said output wave at said different frequency to produce an output wave at said resonant frequency for application to the connection means of said hollow wave energy structure to sustain said oscillatory output.

References Cited in the file of this patent

UNITED STATES PATENTS

| | | |
|---|---|---|
| 2,265,796 | Boersch | Dec. 9, 1941 |
| 2,589,494 | Hershberger | Mar. 18, 1952 |
| 2,705,284 | Hershberger | Mar. 29, 1955 |
| 2,707,235 | Townes | Apr. 26, 1955 |
| 2,770,729 | Dicke | Nov. 13, 1956 |